United States Patent
Cheng et al.

(10) Patent No.: US 9,871,517 B1
(45) Date of Patent: Jan. 16, 2018

(54) METHOD FOR DETERMINING RESISTANCE CALIBRATION DIRECTION IN ZQ CALIBRATION OF MEMORY DEVICE

(71) Applicant: ELITE SEMICONDUCTOR MEMORY TECHNOLOGY INC., Hsinchu (TW)

(72) Inventors: Yu-Hsuan Cheng, New Taipei (TW); Jian-Sing Liou, Kaohsiung (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 15/239,806

(22) Filed: Aug. 17, 2016

(51) Int. Cl.
*H03K 17/16* (2006.01)
*H03K 19/00* (2006.01)

(52) U.S. Cl.
CPC .................. *H03K 19/0005* (2013.01)

(58) Field of Classification Search
None
See application file for complete search history.

(56) References Cited

U.S. PATENT DOCUMENTS

| | | | | |
|---|---|---|---|---|
| 9,287,872 B2* | 3/2016 | Kee | .............. | H03K 19/018514 |
| 2007/0143052 A1* | 6/2007 | Fujisawa | ............. | H04L 25/0278 |
| | | | | 702/107 |
| 2007/0152704 A1* | 7/2007 | Park | .................... | G11C 7/1051 |
| | | | | 326/30 |
| 2007/0236248 A1* | 10/2007 | Park | ....................... | G11C 5/063 |
| | | | | 326/30 |
| 2008/0112246 A1* | 5/2008 | Mei | ....................... | G11C 7/1051 |
| | | | | 365/210.1 |
| 2009/0058458 A1* | 3/2009 | Kim | ....................... | G11C 7/1051 |
| | | | | 326/30 |
| 2009/0115449 A1* | 5/2009 | Kim | ....................... | G11C 5/063 |
| | | | | 326/30 |
| 2010/0007375 A1* | 1/2010 | Lee | ..................... | H04L 25/0298 |
| | | | | 326/30 |
| 2014/0266299 A1* | 9/2014 | Seol | .................. | H03K 19/0005 |
| | | | | 326/30 |

* cited by examiner

*Primary Examiner* — Crystal L Hammond
(74) *Attorney, Agent, or Firm* — Skaar Ulbrich Macari, P.A.

(57) ABSTRACT

A method for determining a resistance calibration direction in ZQ calibration of a memory device includes: repeatedly comparing a reference voltage with an target voltage by a comparator to obtain an odd plurality of comparison outputs, each of the comparison outputs being one of a high-level state and a low-level state; determining a majority of the comparison outputs for their states by a ZQ calibration controller; and determining a resistance calibration direction according to the majority by the ZQ calibration controller so that the ZQ calibration controller generates a calibration code based on the resistance calibration direction and applies the calibration code to a resistance calibration unit to adjust the target voltage via the resistance calibration unit.

6 Claims, 4 Drawing Sheets

US 9,871,517 B1

METHOD FOR DETERMINING RESISTANCE CALIBRATION DIRECTION IN ZQ CALIBRATION OF MEMORY DEVICE

FIELD

Aspects of the present disclosure are related generally to ZQ calibration of a memory device, and more particularly, to a method for determining a resistance calibration direction in the ZQ calibration.

BACKGROUND

To acquire better signal integrity, ZQ calibration is presented since DDR3 appeared for calibrating On Die Termination (ODT) and tracking pull-up/pull-down resistance regardless of Process-Voltage-Temperature (PVT) variations. Generally, the ZQ calibration is performed by the following steps: comparing a reference signal and a target signal by a comparator; generating a calibration code by a ZQ calibration controller depending on the comparison output; applying the calibration code to a resistance calibration unit (pull-up/pull-down resistance calibration unit) by the ZQ calibration controller to adjust the target signal via the resistance calibration unit; and replacing the target voltage with the adjusted target voltage and repeating the above steps until the target voltage is equivalent or almost equivalent to the reference voltage. Depending on system environment with various noises and interferences, the comparison output of the comparator may be incorrect or misjudged. Once the comparison output is incorrect or misjudged, the calibration code generated by the ZQ calibration controller may depart much from the final calibration code which drives the target voltage to get on for the reference voltage, especially as the ZQ calibration controller use a dichotomy search method to generate the calibration code. In view of this, it is important in the art to avoid that a comparator provides an incorrect comparison out for a ZQ calibration controller in ZQ calibration of a memory device.

SUMMARY

The following presents a simplified summary of one or more aspects to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

One aspect of the present disclosure provides a method for determining a resistance calibration direction in ZQ calibration of a memory. The method comprises: repeatedly comparing a reference voltage with an target voltage by a comparator to obtain an odd plurality of comparison outputs, each of the comparison outputs being one of a high-level state and a low-level state; determining a majority of the comparison outputs for their states by a ZQ calibration controller; and determining a resistance calibration direction according to the majority by the ZQ calibration controller so that the ZQ calibration controller generates a calibration code based on the resistance calibration direction and applies the calibration code to a resistance calibration unit to adjust the target voltage via the resistance calibration unit. By determining the majority of an odd plurality of comparison outputs, the ZQ calibration controller can still generate a desired calibration code tending to the final calibration code which drives the target voltage to get on for the reference voltage even if some of the comparison outputs are incorrect due to various noises and interferences. Therefore, the proposed method provides a useful solution as for how to avoid that a comparator provides an incorrect comparison out for a ZQ calibration controller in ZQ calibration of a memory device.

Other implement details and exemplary embodiments will be apparent from the following description accompanied with the appended drawings. Also, it is understood that other aspects will become readily apparent to those of ordinary skill in the art from the following description accompanied with the appended drawings.

DETAILED DESCRIPTION

The detailed description set forth below, in connection with the appended drawings, is intended as a description of various example configurations and is not intended to represent the only configurations in which the concepts described herein may be practiced. The detailed description includes specific details for the purpose of providing a thorough understanding of the various concepts. However, it will be apparent to those of ordinary skill in the art that these concepts may be practiced without these specific details. In some instances, well-known structures and components are shown in block diagram form to avoid obscuring such concepts.

Figure 1:
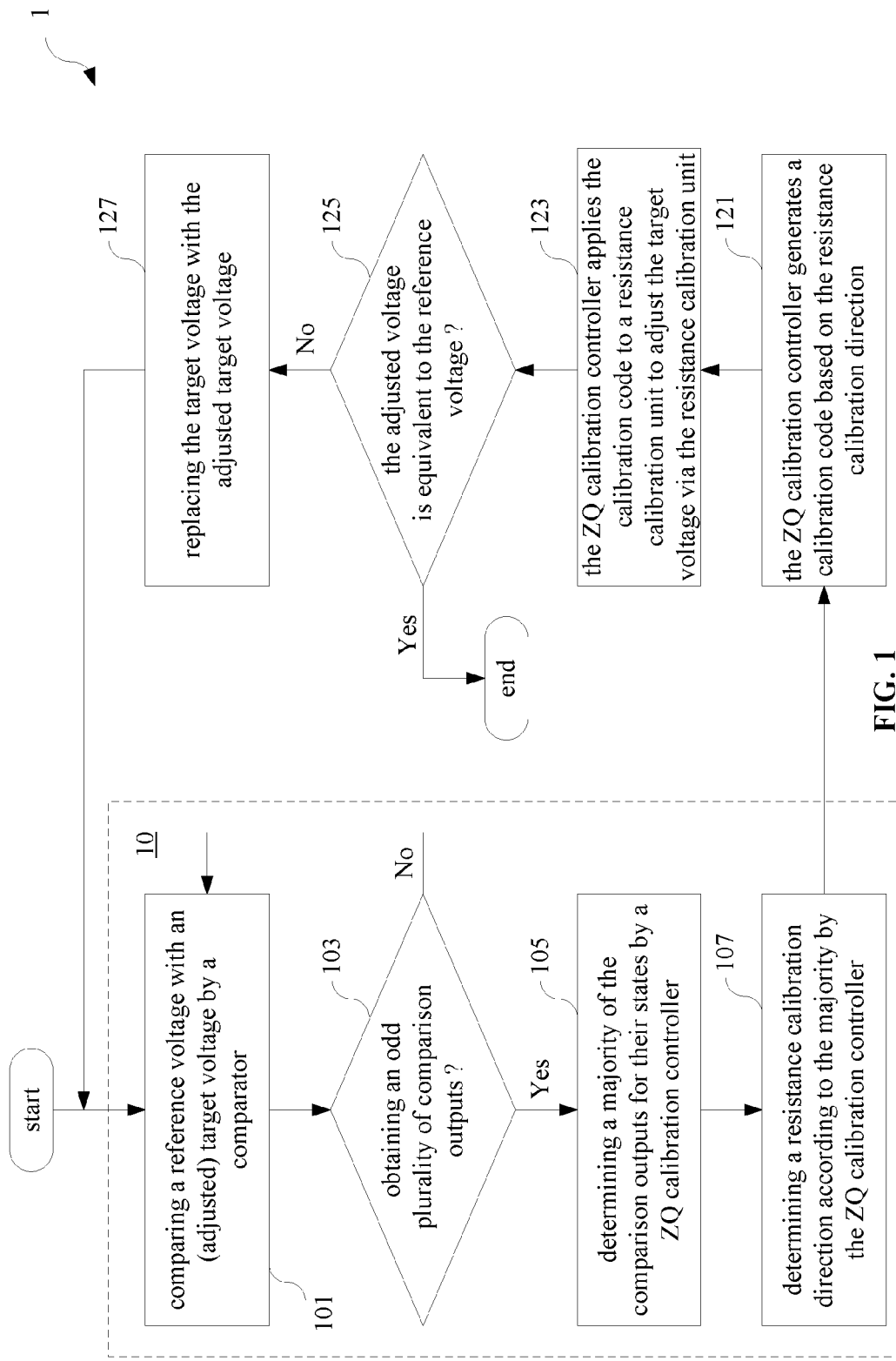
FIG. 1 is a flow chart conceptually illustrating an example of ZQ calibration of a memory device according to one or more embodiments.
Figure 2:
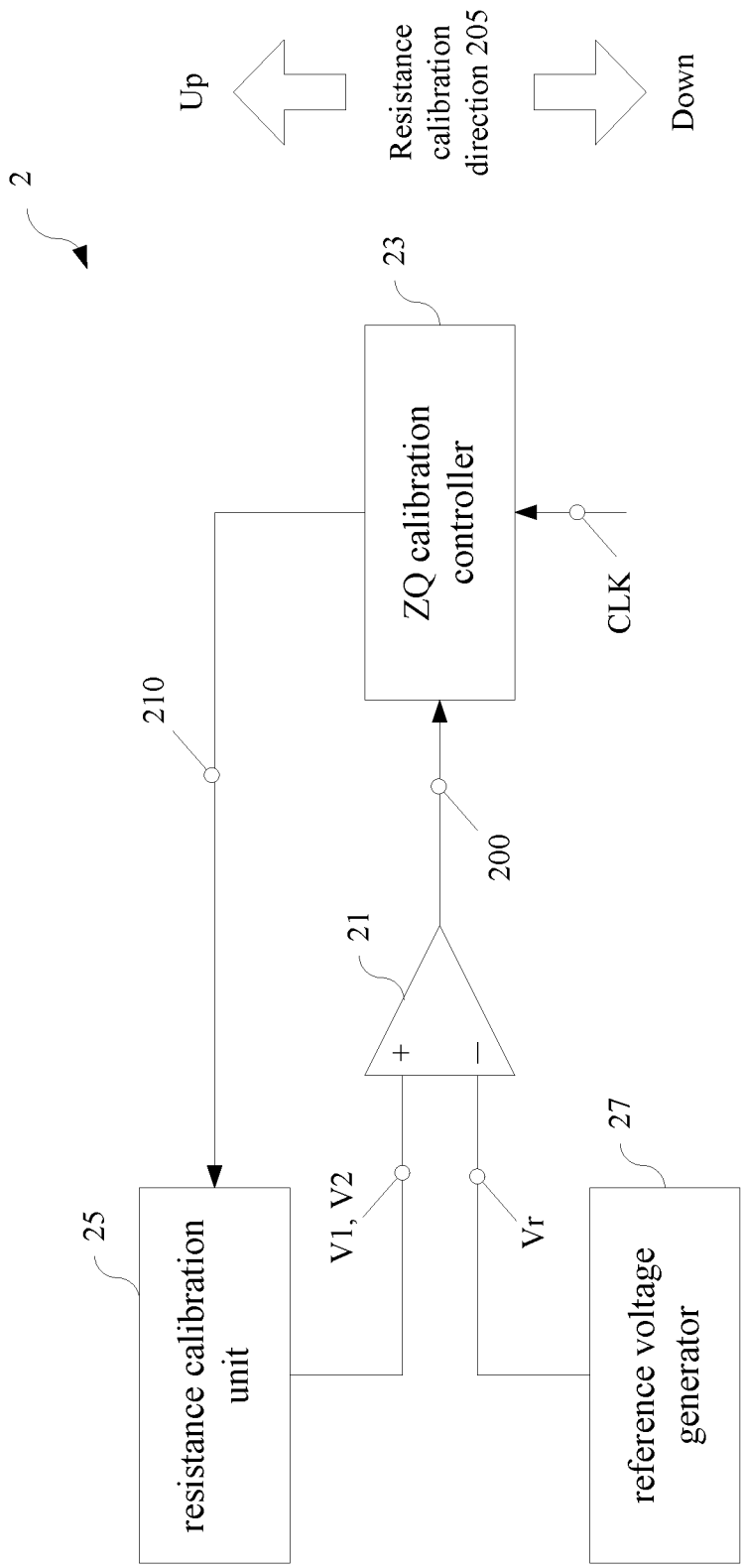
FIG. 2 is a block diagram conceptually illustrating an example of an architecture for implementing the ZQ calibration according to one or more embodiments.
Figure 3:
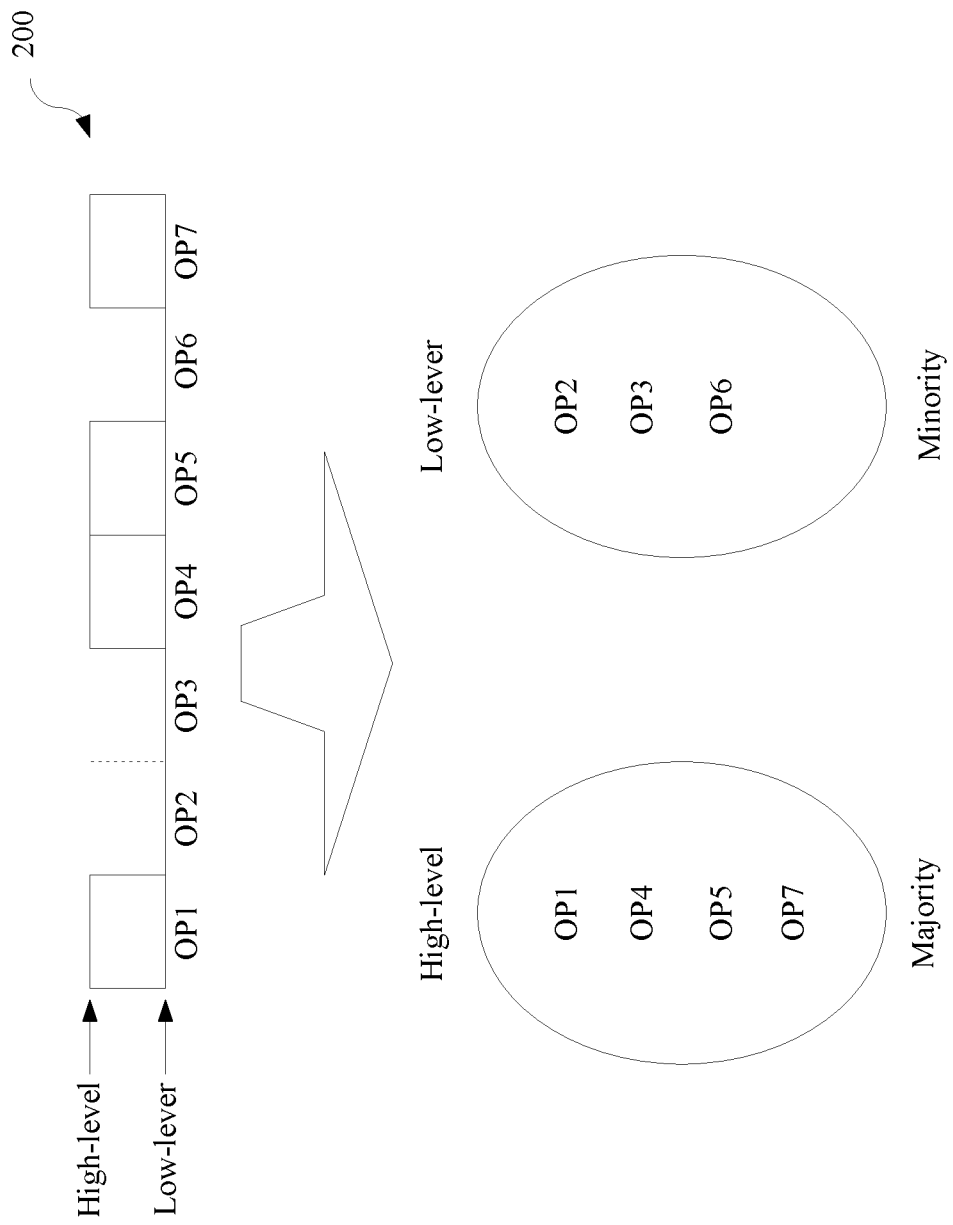
FIG. 3 is a schematic view conceptually illustrating an example of determining a majority of comparison outputs of a comparator for their states by a ZQ calibration controller according to one or more embodiments.
Figure 4:
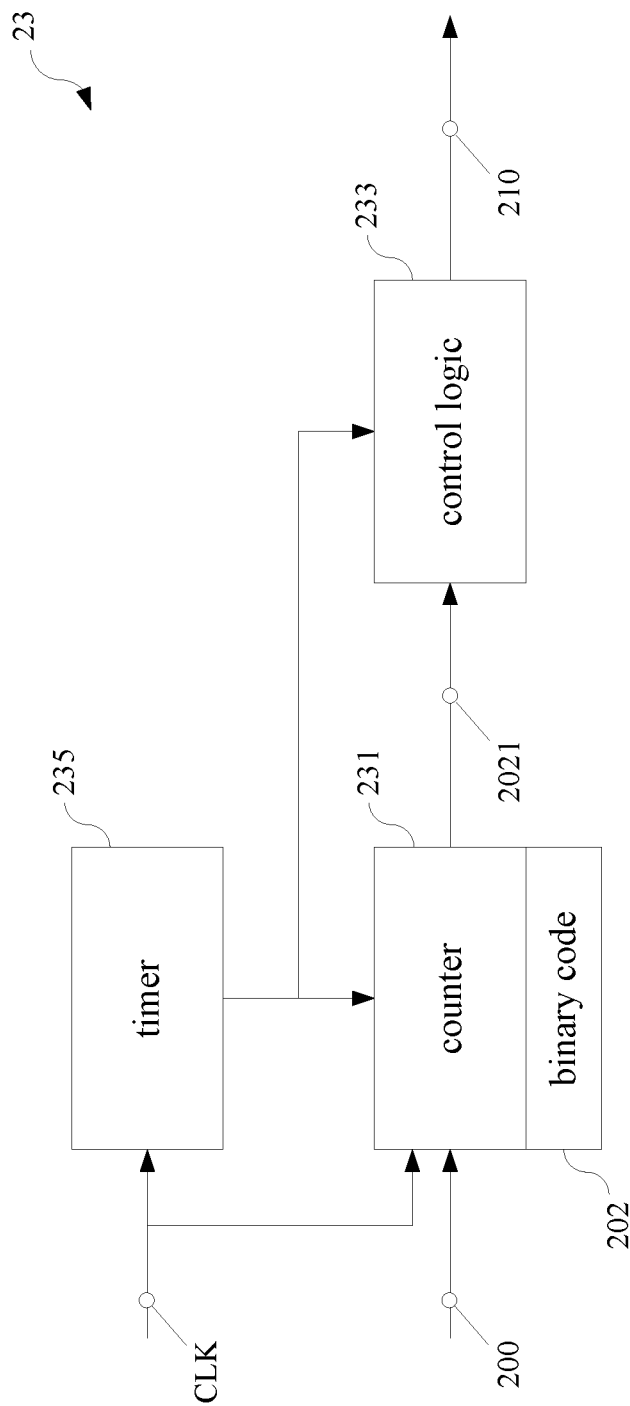
FIG. 4 is a block diagram conceptually illustrating an example of a ZQ calibration controller according to one or more embodiments.

One aspect of the present disclosure provides a method for determining a resistance calibration direction in ZQ calibration of a memory device, which will be described with FIGS. 1-4. FIG. 1 is a flow chart conceptually illustrating an example of ZQ calibration 1 of a memory device according to one or more embodiments. FIG. 2 is a block diagram conceptually illustrating an example of an architecture 2 for implementing the ZQ calibration 1 according to one or more embodiments. The architecture 2 may include a comparator 21, a ZQ calibration controller 23, a resistance calibration unit 25 and a reference voltage generator 27. FIG. 3 is a schematic view conceptually illustrating an example of determining a majority of comparison outputs 200 of the comparator 21 for their states by the ZQ calibration controller 23 according to one or more embodiments. FIG. 4 is a block diagram conceptually illustrating an example of the ZQ calibration controller 23 according to one or more embodiments.

Referring to FIGS. 1-2, the ZQ calibration 1 includes a method 10 for determining a resistance calibration direction 205. The ZQ calibration 1 may be a coarse tuning calibration process, a fine tuning calibration process or both. For example, in DDR3, there are two calibration processes for different calibration durations. One is ZQ Calibration Long (ZQCL) which takes 512 clocks to complete calibration during power-up initialization and reset and takes 256 clocks to complete a calibration at any time. Another is ZQ Calibration Short (ZQCS) which only requires 64 clocks to complete calibration. Sometimes, ZQCL corresponds to the coarse tuning calibration process, while ZQCS corresponds to the fine tuning calibration process.

In the method 10, comparing a reference voltage Vr with a target voltage V1 by the comparator 21 is performed at a step 101. The comparator 21 may be a device that compares two voltages and outputs a digital signal indicating which is larger. The comparator 21 has two analog input terminals V+ and V− which used to receive the target voltage V1 and the reference voltage Vr respectively and one binary digital output terminal which used to provide comparison outputs 200 each of which is one of a high-level state (e.g., digital one) and a low-level state (e.g., digital zero). For example, the comparator 21 may be an operational amplifier voltage comparator which has a well-balanced difference input and a very high gain. The reference voltage Vr may be generated by the reference voltage generator 27 such as various analog signal generators used in the art. The target voltage V1 is an initial voltage which is predefined for the first comparison of the comparator 21. Due to various noises and interferences unavoidable, the reference voltage Vr and the target voltage V1 (or an adjusted target voltage V2) generally are variable with an unexpected deviation over time. Under the circumstances, the comparison output 200 of the comparator 21 may be incorrect or misjudged. To overcome the problem, steps 103, 105 and 107 are performed as mentioned below in detail.

Determining whether a predefined odd plurality of comparison outputs 200 have been obtained is performed at the step 103. For example, the ZQ calibration controller 23 may predefine an odd number excluding one (i.e., 3, 5, 7, 9, 11, or . . . ) and determine whether the accumulated number of the comparison outputs 200 equals to the predefined odd number. If the predefined odd plurality of comparison outputs 200 have not been obtained yet at the step 103, comparing the reference voltage Vr with the target voltage V1 again (i.e., going back to the step 101). Otherwise, determining a majority of the comparison outputs 200 for their states by the ZQ calibration controller 23 is performed at the step 105. Next, determining the resistance calibration direction 205 according to the majority by the ZQ calibration controller 23 is performed at the step 107.

FIG. 3 shows, for example, how to determine a majority of seven comparison outputs 200 in a case where the comparator 21 has compared the reference voltage Vr with the target voltage V1 seven times in order. In the case, the first comparison output OP1, the fourth comparison output OP4, the fifth comparison output OP5 and the seventh comparison output OP7 are the high-level state (e.g., digital one), while the second comparison output OP2, the third comparison output OP3 and the sixth comparison output OP6 are the low-level state (e.g., digital one). Since the number of the high-level is more than that of the low-level state, the ZQ calibration controller 23 determines that the high-level state is a majority of the seven comparison outputs OP1-OP7 while the low-level state is a minority of the seven comparison outputs OP1-OP7. Note that the number of the comparison outputs 200 and their states as shown in FIG. 3 are not intended to be a limitation.

Depending on the majority (or the minority) of comparison outputs 200, the ZQ calibration controller 23 may determine the resistance calibration direction 205 at the step 107. For example, the ZQ calibration controller 23 may determine that the resistance calibration direction 205 is an up-direction (i.e., the resistance of the resistance calibration unit 25 need to increase) in a case where the high-level state is the majority of a predefined odd plurality of comparison outputs 200 and determine that the resistance calibration direction 205 is a down-direction (i.e., the resistance of the resistance calibration unit 25 need to decrease) in a case where the low-level state is the majority of the predefined odd plurality of comparison outputs 200. Alternatively, the ZQ calibration controller 23 may determine that the resistance calibration direction 205 is an up-direction in a case where the low-level state is the majority of the predefined odd plurality of comparison outputs 200 and determine that the resistance calibration direction 205 is a down-direction in a case where the high-level state is the majority of the predefined odd plurality of comparison outputs 200.

After determining the resistance calibration direction 205, the ZQ calibration controller may generate a calibration code 210 based on the resistance calibration direction 205 in response to a system clock signal CLK at a step 121. Next, the ZQ calibration controller 23 may apply the calibration code 210 to the resistance calibration unit 25 to adjust the target voltage V1 via the resistance calibration unit 25 at a step 123.

The ZQ calibration controller 23 may use a sequential (linear) search method, a dichotomy (binary) search method or both to generate the calibration code 210. The sequential search method and the dichotomy search method both used to find a target value (i.e., the final calibration code which drives the target voltage V1 to get on for the reference voltage Vr) within a search list. The sequential search method sequentially checks each element of the search list for the target value without jumping until a match is found. In comparison, every search in/of the dichotomy search method divides the current search list into an upper half list and a lower half list with a watershed which is the middle of the search list, determines which half list the target value falls in, and performs the division and determination within the half list where the target value falls in again. The same processes are performed repeatedly until a match is found.

The resistance calibration unit 25 may be a pull-up resistance calibration unit or a pull-down resistance calibration unit which has been adopted in the art. For example, the pull-up resistance calibration unit may include switches (e.g., MOS Transistors) and resistors each pair of which is disposed in parallel and adjust the resistors via the switches according to the calibration code 210 to perform pull-up calibration so that the resistance of the pull-up resistance calibration unit approaches the resistance of a reference resistor. The reference resistor, which interfaces a ZQ pin of the memory device with ground, generally has a resistance of 240Ω. Likewise, the pull-down resistance calibration unit may also include switches (e.g., MOS Transistors) and resistors each pair of which is disposed in parallel and adjust the resistors via the switches according to the calibration code 210 to perform pull-down calibration so that the resistance of the pull-down resistance calibration unit approaches the reference resistance. In a case where the memory device includes both of the pull-up resistance calibration unit and the pull-down resistance calibration, they may perform the pull-up calibration and the pull-down calibration according to respective calibration codes 210 generated by the ZQ calibration controller 23.

After the ZQ calibration controller 23 adjusts the target voltage V1 via the resistance calibration unit 25, the target voltage V1 may be adjusted into an adjusted voltage V2. Then, determining whether the adjusted voltage V2 is equivalent or almost equivalent to the reference voltage Vr is performed at a step 125. If the determination at the step 125 is positive, the ZQ calibration 1 is finished. Otherwise, replacing the target voltage V1 with the adjusted target voltage V2 is performed at a step 127 and then the ZQ calibration 1 go back to the step 101.

Here provided an implement as for how to determine the majority of the comparison outputs 200, but this implement is not intend to be a limitation. Referring to FIG. 4, the ZQ calibration controller 23 may comprise a counter 231, a control logic 233 and a timer 235 in the implement. The timer 235 is disposed for measuring time intervals according to the system clock system CLK and controls the respective action moments of the counter 231 and the control logic 233. The counter 231 may be a device which stores the number of times a particular event or process has occurred. The control logic 233 controls the operations of the ZQ calibration controller 23.

In the implement, after a predefined odd plurality of comparison outputs 200 have been obtained, the step 105 may be performed as follows: defining a binary code 202 of the counter 231 in the ZQ calibration controller 23; for each of the comparison outputs 200, adding one into the binary code 202 if its state is the high-level state and subtracting one from the binary code 202 if its state is the low-level state by the counter 231; determining Most Significant Bit (MSB) 2021 of the binary code 202 after the counter 231 adjusts the binary code 202 according the states of all of the comparison outputs 200; and determining the majority of the comparison outputs 200 according to the MSB 2021.

The bit number and value of the binary code 202 of the counter 231 may be optionally defined for different needs. For example, the binary code 202 of the counter 231 may be defined as a five-bit code with an initial value of 16, i.e., "10000". The binary code 202 of the counter 231 becomes "10001" (i.e., adding digital "1" into the binary code 202) if the incoming comparison outputs 200 is the high-level state, while the binary code 202 of the counter 231 becomes "01111" (i.e., subtracting digital "1" from the binary code 202) if the incoming comparison outputs 200 is the low-level state. As applying the binary code 202 of the counter 231 to the seven comparison outputs OP1-OP7 shown in FIG. 3, the binary code 202 finally becomes "10001" where the MSB (the leftmost bit) 2021 is "one" (i.e., the high-level state). Under the circumstances, the control logic 233 determine the high-level state as the majority of the seven comparison outputs OP1-OP7. In a case where the MSB 2021 of the final binary code 202 is "zero" (i.e., the low-level state), the control logic 233 determines the low-level state as the majority of the seven comparison outputs OP1-OP7.

According previous description of the disclosure, the ZQ calibration controller can still generate a desired calibration code tending to the final calibration code which drives the target voltage to get on for the reference voltage by determining the majority of an odd plurality of comparison outputs even if some of the comparison outputs are incorrect due to various noises and interferences. Therefore, the proposed method provides a useful solution as for how to avoid that a comparator provides an incorrect comparison out for a ZQ calibration controller in ZQ calibration of a memory device.

The previous description of the disclosure is provided to enable any person of ordinary skill in the art to make or use the disclosure. Various modifications to the disclosure will be readily apparent to those of ordinary skill in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein. Although such modifications and replacements are not fully disclosed in the previous description, they have been substantially covered in the following claims as appended.

What is claimed is:

1. A method for determining a resistance calibration direction in ZQ calibration of a memory device, comprising:
   repeatedly comparing a reference voltage with an target voltage by a comparator to obtain an odd plurality of comparison outputs, each of the comparison outputs being one of a high-level state and a low-level state;
   determining a majority of the comparison outputs for their states by a ZQ calibration controller; and
   determining a resistance calibration direction based on the majority by the ZQ calibration controller so that the ZQ calibration controller generates a calibration code based on the resistance calibration direction and applies the calibration code to a resistance calibration unit to adjust the target voltage via the resistance calibration unit.

2. The method as claimed in claim 1, wherein determining the majority of the comparison outputs further comprises:
   defining a binary code of a counter in the ZQ calibration controller;
   for each of the comparison outputs, adding one into the binary code if its state is the high-level state and subtracting one from the binary code if its state is the low-level state by the counter;
   determining Most Significant Bit (MSB) of the binary code after the counter adjusts the binary code according the states of all of the comparison outputs; and
   determining the majority of the comparison outputs according to the MSB.

3. The method as claimed in claim 1, wherein the ZQ calibration is a coarse tuning calibration process or a fine tuning calibration process.

4. The method as claimed in claim 1, wherein the ZQ calibration controller uses a sequential search method or a dichotomy search method to generate the calibration code.

5. The method as claimed in claim 1, wherein the resistance calibration unit is a pull-up resistance calibration unit or a pull-down resistance calibration unit.

6. The method as claimed in claim 1, wherein the reference voltage with the target voltage both are variable over time.

* * * * *